(12) United States Patent
Aguilar Santillan et al.

(10) Patent No.: US 12,062,565 B2
(45) Date of Patent: Aug. 13, 2024

(54) ELECTROSTATIC CHUCK, ASSEMBLY INCLUDING THE ELECTROSTATIC CHUCK, AND METHOD OF CONTROLLING TEMPERATURE OF THE ELECTROSTATIC CHUCK

(71) Applicant: ASM IP Holding B.V., Almere (NL)

(72) Inventors: Joaquin Aguilar Santillan, Gilbert, AZ (US); Hong Gao, San Jose, CA (US); Shanker Kuttath, Austin, TX (US); ChangMin Lee, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 209 days.

(21) Appl. No.: 17/848,824

(22) Filed: Jun. 24, 2022

(65) Prior Publication Data

US 2022/0415694 A1 Dec. 29, 2022

Related U.S. Application Data

(60) Provisional application No. 63/216,141, filed on Jun. 29, 2021.

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01); *H01L 21/67248* (2013.01)

(58) Field of Classification Search
CPC .......... H01L 21/6833; H01L 21/67103; H01L 21/67248; H01L 21/67109; H01L 21/67213; H01L 21/6831; H01L 21/68714; H01L 21/67276; H01L 21/68757; G01K 7/16; H01J 37/32724; H05B 3/12; H05B 3/283
USPC ....................................................... 361/234
See application file for complete search history.

(56) References Cited

U.S. PATENT DOCUMENTS

| | | | |
|---|---|---|---|
| 3,197,682 A | 7/1965 | Klass et al. | |
| 3,634,740 A | 1/1972 | Stevko | |
| 3,916,270 A | 10/1975 | Wachtler et al. | |
| 3,983,401 A | 9/1976 | Livesay | |
| 4,184,188 A | 1/1980 | Briglia | |
| 4,384,918 A | 5/1983 | Abe | |
| 4,412,133 A | 10/1983 | Eckes et al. | |
| 4,480,284 A | 10/1984 | Tojo et al. | |

(Continued)

FOREIGN PATENT DOCUMENTS

| | | | |
|---|---|---|---|
| JP | 5979545 A | 5/1984 | |
| JP | 59127847 A | 7/1984 | |

(Continued)

OTHER PUBLICATIONS

EPO; Search Report dated Oct. 28, 2022 in Application No. 22181531.9.

*Primary Examiner* — Dharti H Patel
(74) *Attorney, Agent, or Firm* — Snell & Wilmer L.L.P.

(57) ABSTRACT

Electrostatic chucks and methods of using electrostatic chucks are disclosed. Exemplary electrostatic chucks include a ceramic body, a heating element embedded within the ceramic body, and two or more temperature measurement devices embedded within the ceramic body. Exemplary methods include measuring temperatures within the electrostatic chuck using two or more vertically spaced-apart temperature measurement devices.

19 Claims, 3 Drawing Sheets

(56) References Cited

U.S. PATENT DOCUMENTS

| | | | |
|---|---|---|---|
| 4,502,094 A | 2/1985 | Lewin et al. | |
| 4,520,421 A | 5/1985 | Sakitani et al. | |
| 4,551,192 A | 11/1985 | Di Milia et al. | |
| 4,554,611 A | 11/1985 | Lewin | |
| 5,117,121 A | 5/1992 | Watanabe et al. | |
| 9,948,214 B2 | 4/2018 | Lubomirsky | |
| 10,636,630 B2 * | 4/2020 | Mungekar | H01L 21/67103 |
| 10,973,088 B2 * | 4/2021 | Parkhe | H01L 21/67103 |
| 11,265,971 B2 | 3/2022 | Parkhe | |
| 11,430,686 B2 * | 8/2022 | Ulavi | H01L 21/6833 |
| 11,848,177 B2 * | 12/2023 | Wang | H01L 21/67248 |
| 11,862,488 B2 * | 1/2024 | Hara | H01L 21/67103 |
| 11,875,977 B2 * | 1/2024 | Koshimizu | H01L 21/6831 |
| 2006/0075969 A1 | 4/2006 | Fischer | |
| 2007/0258186 A1 | 11/2007 | Matyushkin | |
| 2014/0204501 A1 * | 7/2014 | Moriya | H01L 21/6833 361/234 |
| 2016/0035544 A1 | 2/2016 | Lubomirsky et al. | |
| 2016/0345384 A1 | 11/2016 | Zhang et al. | |
| 2017/0051406 A1 * | 2/2017 | Mori | C23C 16/50 |
| 2017/0098564 A1 | 4/2017 | Pape | |
| 2017/0178978 A1 | 6/2017 | Choi | |
| 2021/0005480 A1 * | 1/2021 | Divakar | B32B 18/00 |
| 2021/0022212 A1 * | 1/2021 | Cimino | H01L 21/67063 |
| 2021/0111058 A1 * | 4/2021 | Ulavi | H01L 21/67103 |
| 2021/0366693 A1 | 11/2021 | Lee | |
| 2022/0044916 A1 | 2/2022 | Um | |

FOREIGN PATENT DOCUMENTS

| | | | | |
|---|---|---|---|---|
| JP | 60110133 | | 6/1985 | |
| JP | 01185176 | | 7/1989 | |
| JP | 01313954 | | 12/1989 | |
| JP | 03211753 | | 9/1991 | |
| WO | 2005053360 A2 | | 6/2005 | |
| WO | WO-2012115913 A2 * | 8/2012 | | H01L 21/67103 |
| WO | WO-2019074843 A1 * | 4/2019 | | C23C 16/4586 |

* cited by examiner

ELECTROSTATIC CHUCK, ASSEMBLY INCLUDING THE ELECTROSTATIC CHUCK, AND METHOD OF CONTROLLING TEMPERATURE OF THE ELECTROSTATIC CHUCK

CROSS-REFERENCE TO RELATED APPLICATIONS

This application claims priority to U.S. Provisional Patent Application Ser. No. 63/216,141 filed Jun. 29, 2021, titled ELECTROSTATIC CHUCK, ASSEMBLY INCLUDING THE ELECTROSTATIC CHUCK, AND METHOD OF CONTROLLING TEMPERATURE OF THE ELECTROSTATIC CHUCK, the disclosure of which is hereby incorporated by reference in its entirety.

FIELD OF INVENTION

The present disclosure generally relates to substrate supports and assemblies. More particularly, the disclosure relates to electrostatic chucks and/or heaters suitable for supporting substrates, to assemblies including the electrostatic chucks and/or heaters, and to methods of using the substrate supports and assemblies.

BACKGROUND OF THE DISCLOSURE

Electrostatic chucks can be used for a variety of applications during the formation of devices. For example, an electrostatic chuck can be used to support and retain a substrate, such as a wafer, during lithography, such as extreme ultraviolet lithography (EUVL), plasma-based and/or vacuum-based processing, such as dry etching, plasma enhanced chemical vapor deposition (PECVD), thermal chemical vapor deposition, physical vapor deposition (PVD), ion implantation, and the like. Temperatures during at least some of such processes can be relatively high (e.g., about 800° C.) and/or temperature ramp rates during such processes can be relatively high (e.g., about ~20-30° C./second).

A typical electrostatic chuck can include a non-conducting (e.g., ceramic) body, one or more electrodes (e.g., electrostatic and RF electrodes) embedded in the body, and a heating element or a plurality of heating elements embedded within the body. The electrostatic chuck or a chuck assembly can also include a cooling base attached to the non-conducting body.

During substrate processing, the high temperatures and/or the temperature variation of the electrostatic chuck (e.g., upon heating or cooling the chuck), in combination with the differences in the coefficients of thermal expansion of materials, can cause mechanical fatigue in materials, such as the body, electrodes, or the heating element. The mechanical fatigue, in turn, can result in cracks within the body, heating element(s), and/or electrode(s), resulting in failure of the electrostatic chuck. Time required to repair or replace the electrostatic chuck can cause undesired downtime of reactors or systems including the chuck. Accordingly, improved chucks and methods of using the chucks are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to electrostatic chucks, assemblies including an electrostatic chuck, and to methods of using electrostatic chucks. While the ways in which various embodiments of the present disclosure address drawbacks of prior electrostatic chucks, assemblies, and methods are discussed in more detail below, in general, exemplary electrostatic chucks include a body, a plurality of temperature measurement devices embedded within the body, and at least one heating element embedded within the body. An assembly can further include a controller to receive temperature information from the plurality of temperature measurement devices and use such information to control a temperature of the chuck and/or control temperature differential or a temperature ramp based on a temperature differential or temperatures at two or more locations within the body. The multiple temperature measurement devices allow for temperature gradient measurements within the ceramic body and control of temperature and/or temperature rate change (ramp rate) based on the measured temperature gradients or differences.

In accordance with embodiments of the disclosure, an electrostatic chuck assembly is provided. The electrostatic assembly can include an electrostatic chuck, a controller, and various other components. The electrostatic chuck can include a ceramic body having a top surface for receiving a substrate, a heating element or heater embedded within the ceramic body, a first temperature measurement device embedded within the ceramic body proximate the top surface, and a second temperature measurement device embedded within the ceramic body proximate the heating element. The controller can be coupled to the heating element, the first temperature measurement device and the second temperature measurement device. In accordance with examples of these embodiments, the first temperature measurement device and the second temperature measurement device are vertically spaced apart from each other. In accordance with further examples, the controller controls a rate of a temperature change of the ceramic body based on a first temperature measurement from the first temperature measurement device and a second temperature measurement from the second temperature measurement device. In some cases, a temperature differential between the first temperature measurement device and the second temperature measurement device is maintained below a predetermined threshold. Additionally or alternatively, the controller can maintain the electrostatic chuck at a desired temperature based on the first temperature measurement and the second temperature measurement. In accordance with further examples of these embodiments, the electrostatic chuck assembly includes an electrostatic (e.g., direct current) electrode embedded within the ceramic body. Additionally or alternatively, the electrostatic chuck assembly can include a plasma power (e.g., an alternating current) (e.g., RF and/or MHz) electrode embedded within the ceramic body.

In accordance with further examples of the disclosure, a method of controlling a temperature of an electrostatic chuck is provided. The method includes the steps of providing an electrostatic chuck comprising a ceramic body, a heater or one or more heating elements embedded within the ceramic body, and a plurality of temperature measurement devices embedded within the ceramic body, wherein at least two of the plurality of temperature measurement devices are vertically spaced-apart temperature measurement devices; determining a predetermined threshold for a vertical temperature variation between the vertically spaced-apart temperature measurement devices; measuring a temperature within the electrostatic chuck using the two vertically spaced-apart temperature measurement devices (e.g., during steady state, heating and/or cooling of the electrostatic chuck); and controlling a temperature differential between the two vertically spaced-apart temperature measurement devices below the predetermined threshold. In accordance with examples of these embodiments, the step of controlling includes providing power to a heating element, wherein the power has a frequency between about 0.006 Hz and 1 Hz. The power (or current) can be provided to the heating element using, for example, one or more of pseudo random binary sequence (PRBS), sine sweep signal, and Schroeder phase signal.

In accordance with further examples of the disclosure, methods described herein can be used to generate a transfer function model to generate information used during the step of controlling and/or during design of an electrostatic chuck or an assembly including the electrostatic chuck.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
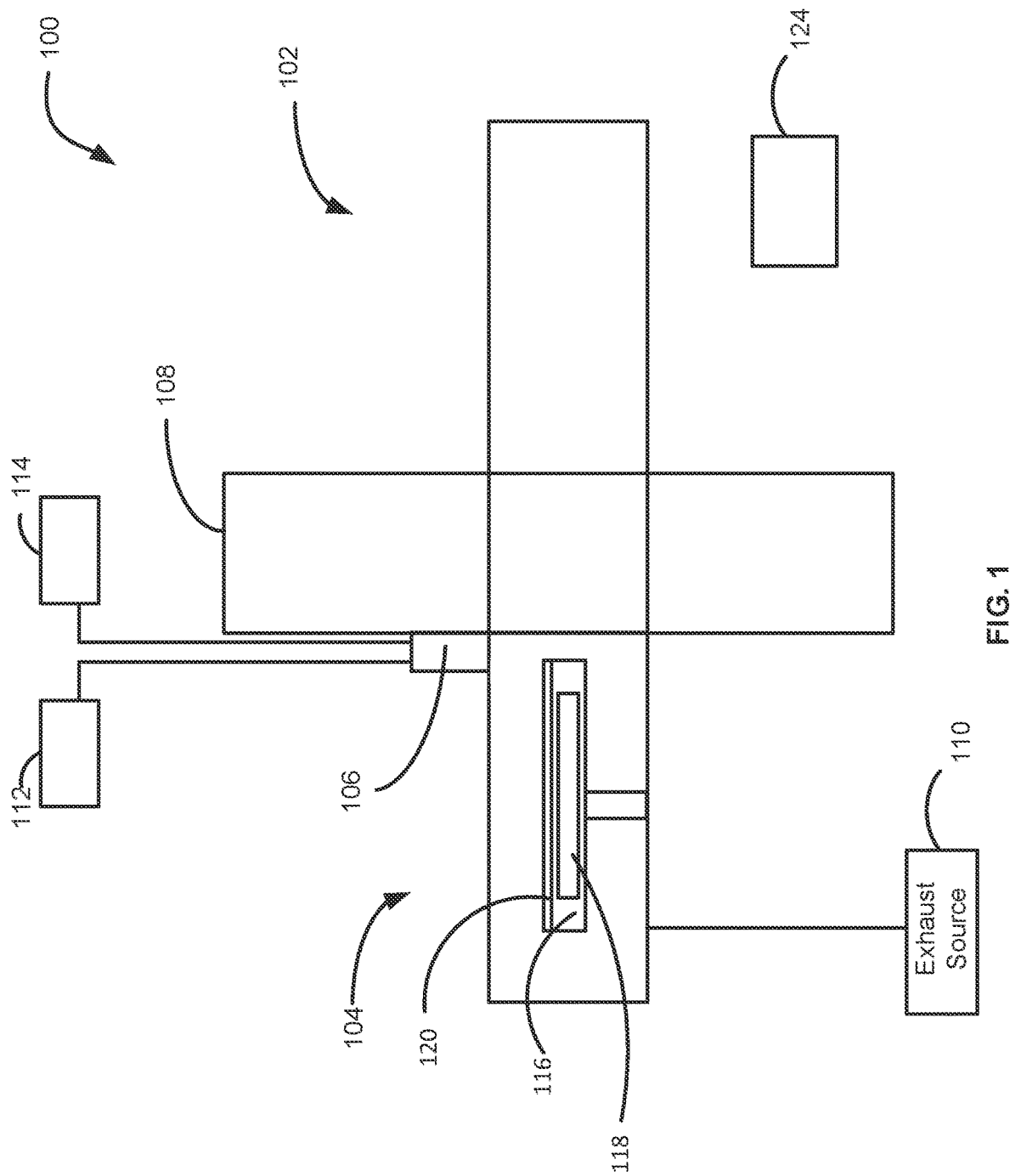
FIG. 1 illustrates a system including an electrostatic chuck and an electrostatic chuck assembly in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to electrostatic chucks and to methods of using electrostatic chucks. The electrostatic chucks and methods as described herein can be used to process substrates to form, for example, electronic devices. By way of examples, the electrostatic chucks can be used in wafer processes, such as lithography, e.g., as extreme ultraviolet lithography (EUVL), plasma-based and/or vacuum-based processing, such as dry etching, plasma-enhanced etching, plasma enhanced chemical vapor deposition (PECVD), thermal chemical vapor deposition, physical vapor deposition (PVD), ion implantation, and the like, used to form electronic devices. Exemplary electrostatic chucks and methods described herein may be particularly useful in high temperature (e.g., greater than 650° C.)plasma processes, where traditional electrostatic chucks may more readily fail.

In this disclosure, "gas" may include material that is a gas at normal temperature and pressure, a vaporized solid and/or a vaporized liquid, and may be constituted by a single gas or a mixture of gases, depending on the context.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various topologies, such as recesses, lines, and the like formed within or on at least a portion of a layer of the substrate.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates an exemplary reactor system 100. Reactor system 100 can be used for a variety of applications, such as, for example, chemical vapor deposition (CVD), plasma-enhanced CVD (PECVD), atomic layer deposition (ALD), clean processes, etch processes, and the like. Other systems may be used for lithography or ion implantation. Although exemplary embodiments are described below in connection with gas-phase reactor systems, embodiments and the disclosure are not so limited, unless stated otherwise.

In the illustrated example, reactor system 100 includes an optional substrate handling system 102, a reaction chamber 104, a gas injection system 106, and optionally a wall 108 disposed between reaction chamber 104 and substrate handling system 102. Reactor system 100 also includes an electrostatic chuck 116 to support one or more substrates or wafers 120. Electrostatic chuck 116 can include one or more embedded devices 118, such as one or more heating elements, one or more cooling elements, and/or one or more electrodes. Reactor system 100 can also suitably include a first gas source 112, a second gas source 114, and an exhaust source 110. Although illustrated with two gas sources 112, 114, reactor system 100 can include any suitable number of gas sources. Further, reactor system 100 can include any suitable number of reaction chambers 104, which can each be coupled to a gas injection system 106. In the case in which reactor system 100 includes multiple reaction chambers, each gas injection system can be coupled to the same gas sources 112, 114 or to different gas sources. Reactor system 100 can also include a controller 124 configured to perform various operations, such as process steps, of reactor system 100.

Figure 2:
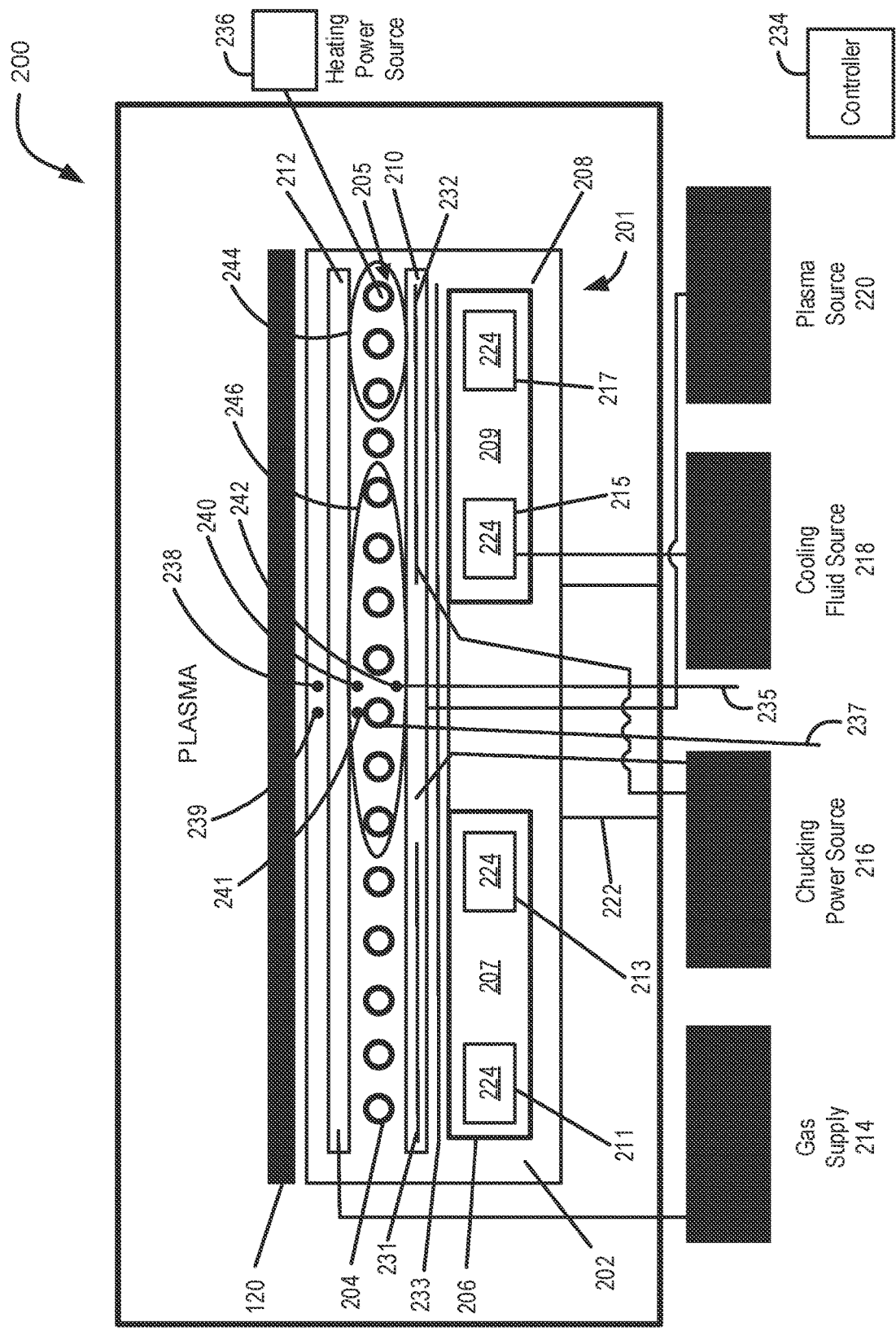
FIG. 2 illustrates a portion of a system and an electrostatic chuck assembly in greater detail and in accordance with at least one embodiment of the disclosure.

FIG. 2 illustrates an electrostatic chuck assembly 200, which includes an electrostatic chuck 201, suitable for use as electrostatic chuck 116, and a controller 234, which can form part of controller 124 or be distinct therefrom. In the illustrated example, electrostatic chuck assembly 200 further includes a gas supply 214, a chucking power source 216, a cooling fluid source 218, a plasma power source 220 and a heating power source 236.

Electrostatic chuck 201 includes a ceramic body 202, one or more heating elements 204 embedded within ceramic body 202, one or more cooling devices 206, 208, a dielectric layer 210, a fluid cavity 212, electrostatic electrodes 231, 232, and a plasma power electrode 233.

Ceramic body 202 can be formed of ceramic material. By way of examples, ceramic body 202 can include one or more of aluminum nitride, boron nitride, silicon carbide, and silicon nitrate. Ceramic body 202 can additionally include an additive selected from, for example, the group consisting of one or more of $Al_2MgO_4$, $Al_2O_3$, $Y_2O_3$, MgO, $CaF_2$, and LiF.

Heating element(s) 204 can be formed of a resistive heating material. By way of examples, one or more heating elements can be formed of one or more of molybdenum, tungsten, an alloy comprising molybdenum, and an alloy comprising tungsten, such as one or more of Mo, W, $Mo_xW_y$, $MoSi_x$, and/or $WSi_x$, where x and y are greater than 0 and less than 1 or between about 0.1 and about 0.5. In some cases, an alloy can include Mo and/or W and up to 50 at % of another element, such as silicon, or the other of Mo and W. Heating element 204 can be in the form of a wire, other forms noted below, or the like. A heater 205 can include one or more heating elements. And, an electrostatic chuck can include one or more heaters. Further, one or more heating elements 204 can form a heating zone (e.g., a heating zone 244 or 246), which can be independently controlled using controller 234 and heating power source 236.

Heating elements 204 can be formed using a variety of techniques. For example, resistive material can be applied to the dielectric material in a predetermined pattern to provide a resistive heater circuit. Such heating elements can be referred to as layered heating elements. Layered heating elements can be "thick" film (e.g., Mo, W), "thin" film (e.g. Mo, W), or "thermally sprayed," among others, wherein a difference between these types of layered heating elements can be the method in which the layers are formed. For example, the layers for thick film heaters can be formed using processes, such as screen printing, decal application, or film printing heads, among others. The layers for thin film heaters are typically formed using deposition processes, such as ion plating, sputtering, chemical vapor deposition (CVD), and physical vapor deposition (PVD), among others. Thermal spraying can include, by way of example, flame spraying, plasma spraying, wire arc spraying, and HVOF (high velocity oxygen fuel), among others. The heating elements can include leads 237 to connect to heating power source 236.

Heating power source 236 can be configured to supply desired power to one or more heating elements 204 and/or heaters 205 comprising one or more heating elements 204. Heating power source 236 can be coupled to controller 234 and to one or more heating elements 204 to provide various forms of power (or current) to heating elements 204. By way of examples, controller 234 and heating power source 236 can be configured to provide power to heating elements 204 at a frequency between about 0.006 Hz and 1 Hz. In accordance with further examples, heating power source 236 can supply power to heating elements 204 using one or more of techniques selected from the group consisting of pseudo random binary sequence (PRBS), sine sweep signal, and Schroeder phase signal.

Cooling devices can include any suitable devices that facilitate cooling at least a portion of electrostatic chuck 201. By way of examples, cooling devices 206, 208 can include a material 207, 209 having conduits 211-217 formed therein. Material 207, 209 can be or include, for example, stainless steel, aluminum, or copper. As illustrated, a cooling fluid 224 can be provided within one or more material 207, 209 to facilitate temperature regulation of electrostatic chuck 201. Exemplary cooling fluid incudes, for example, stainless steel, aluminum, or copper.

Dielectric layer 210 can be formed of a suitable dielectric material, such as a ceramic material. The ceramic material used to form dielectric layer 210 can include a dielectric material that has a higher dielectric resistivity, compared to a dielectric resistivity of ceramic body 202 material. By way of examples, dielectric layer 210 can be or include AlN, $Si_3N_4$, SiC, BN, $Al_2O_3$, optionally with one or more additive selected from the group consisting of CaO, MnO, MgO, AlON, BaO, BeO, $ZrO_2$, CoO, ZnO, $Cr_2O_3$, and $Al_2O_3$; the dielectric layer can form during the sintering process.

Fluid cavity 212 can be formed during a mold and sintering process and can include a void or porous region formed within ceramic body 202. A gas, such as Ar, $N_2$, or CO, from gas supply 214, can be present within fluid cavity 212.

Electrostatic electrodes 231, 232 can be formed of any suitable material. By way of examples, electrostatic electrodes 231, 232 can be formed of Mo, W and alloys including Mo and/or W.

Chucking power source 216 is configured to generate a suitable electrostatic force to retain one or more substrates or wafers 120. By way of example, chucking power source 216 can be or include a direct current power source, which can be coupled to controller 234 and electrostatic electrodes 231, 232.

Plasma power electrode 233 can be formed of a suitable conducting material. For example, plasma power electrode 233 can be formed of a metal, such as molybdenum, or an alloy, such as the molybdenum alloys described herein.

Plasma power source 220 is configured to generate a suitable plasma power between electrostatic chuck 201 and another electrode, such as a shower plate (not illustrated). Plasma power source 220 can be or include, for example, an RF and/or a MHz power supply, which can be coupled to controller 234 and plasma power electrode 233.

Electrostatic chuck 201 includes a plurality of temperature measurement devices. In the illustrated example, electrostatic chuck 201 includes temperature measurement devices 238, 239, 240, 241, 242. Although illustrated with five temperature measurement devices, an electrostatic chuck can include any suitable number (e.g., two or more) of temperature measurement devices. Each temperature measurement device 238-242 can independently be or include, for example, a thermocouple or a resistance temperature detector. Exemplary thermocouples can be formed of, for example, Pt-Rd, or Pt-Rt. Exemplary resistance temperature detector can be formed of any metal alloys e.g., Ni, Pd, Pt base alloys. In accordance with various embodiments of the disclosure, electrostatic chuck 201 includes at least a first temperature measurement device 238 and a second temperature measurement device 240. First temperature measurement device 238 can be embedded within the ceramic body proximate the top surface. Second temperature measurement device 240 can be embedded within the ceramic body proximate the heating element 204. As illustrated, in accordance with examples of the disclosure, first temperature measurement device 238 and second temperature measurement device 240 are vertically spaced-apart from each other. This allows for temperature differences within ceramic body 202 to be measured. In accordance with further examples, one or more additional temperature measurement devices 242 can also be embedded within ceramic body 202. The one or more additional temperature measurement devices can also be vertically and/or be horizontally spaced-apart from temperature measurement devices 238, 240. In accordance with further examples of the disclosure, two or more measurement devices can be spaced apart horizontally. In some cases, one or more temperature measurement devices can be proximate one or two or more heating zones of a plurality of heating zones 244, 246.

Temperature measurement devices 238-242 can be coupled to controller 234 to provide temperature information to controller 234 (e.g., using leads 225), which, in turn, can provide a corresponding signal to heating power source 236 and/or to cooling device 206 and/or 208 to control a desired temperature, temperature differential, and/or temperature ramp rate (up or down) of electrostatic chuck 201 (e.g., of ceramic body 202). Each temperature measurement device 238-242 can include one or more (e.g., two) leads 235 to couple to controller 234.

As noted above, one or more heating elements 204 can be formed within a layer of electrostatic chuck 201. In these cases, one or more temperature measurement devices (e.g., temperature measurement device 242) can be formed within the same layer as one or more heating elements 204 or within another layer of electrostatic chuck 201.

Controller 234 can be configured to perform various functions and/or steps as described herein. In particular, controller 234 can be configured for causing electrostatic chuck assembly 200 to perform to control a temperature of electrostatic chuck 201 and to provide a suitable electrostatic chucking force.

Controller 234 can include one or more microprocessors, memory elements, and/or switching elements to perform the various functions. Although illustrated as a single unit, controller 234 can alternatively comprise multiple devices. By way of examples, controller 234 can be used to control gas flow of a gas from gas supply 214, chucking power from chucking power source 216, cooling fluid 224 flow from cooling fluid source 218, plasma power from plasma power source 220 and/or heating power from heating power source 236. Controller 234 can be configured to control a temperature of electrostatic chuck using temperature information from two or more temperature measurement devices, one or more heating elements and one or more cooling devices, such that a difference between a temperature measured by two or more temperature measurement devices (e.g., temperature measurement devices 238, 240) are maintained below a predetermined threshold. A predetermined threshold can be, for example, 0.2, 0.4, 0.6 degrees C. or less.

In accordance with examples of the disclosure, controller 234 receives temperature information from a plurality of temperature measurement devices 238-242 and provides information to heating power source 236 and/or cooling devices 206, 208 to control a temperature of electrostatic chuck using closed-loop temperature control based on temperature information from the plurality of temperatures. The closed-loop temperature control can begin at the start of a heating process, to maintain a temperature differential between two or more temperature measurement devices below the threshold. Further, the controller can use proportional-integral-derivative control to control the temperature to within the predetermined threshold.

Figure 3:
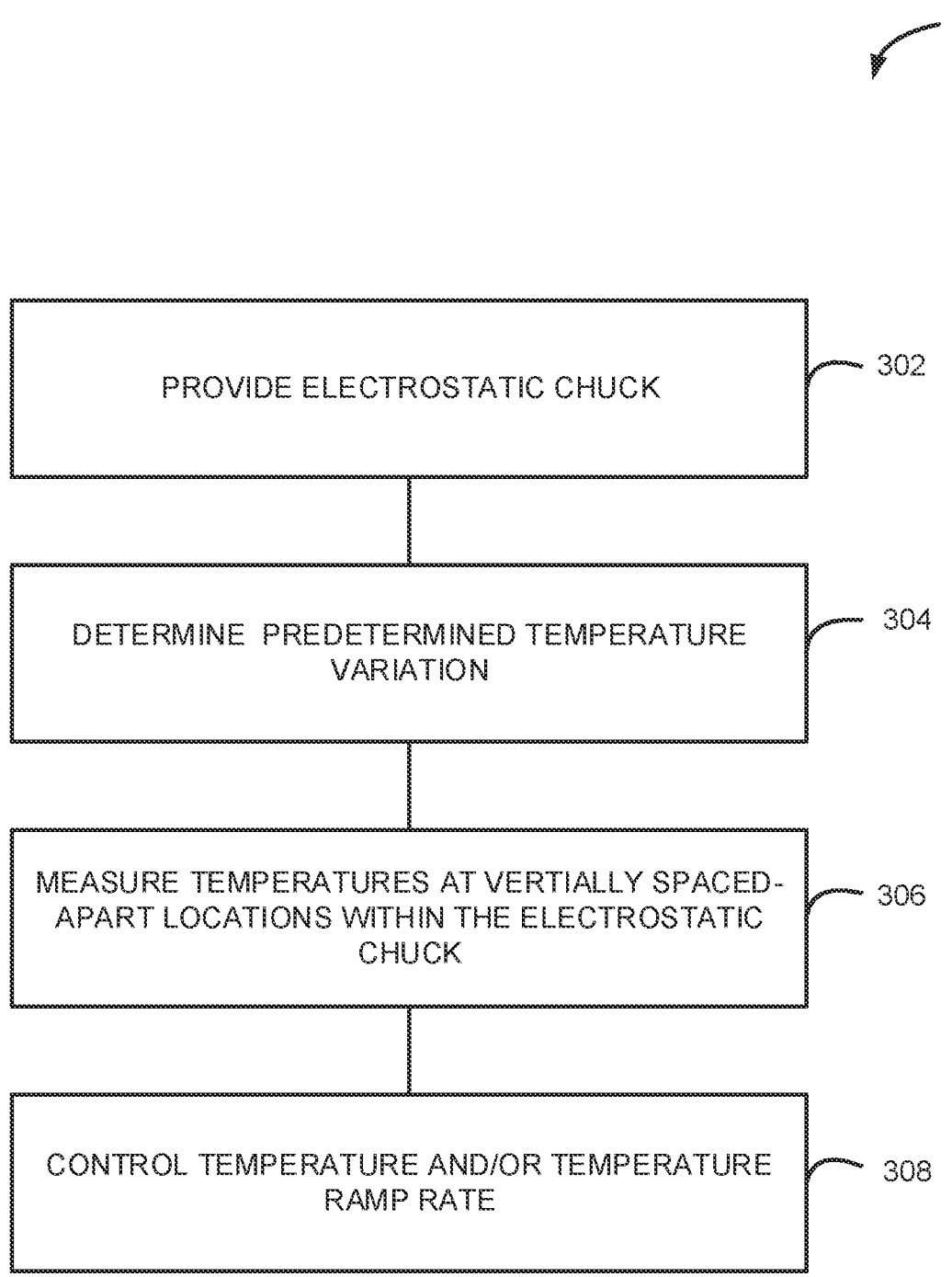
FIG. 3 illustrates a method in accordance with at least one embodiment of the disclosure.

Turning now to FIG. 3, a method 300 of controlling a temperature of an electrostatic chuck in accordance with embodiments of the disclosure is illustrated. Method 300 includes the steps of providing an electrostatic chuck (302), determining a predetermined threshold for a vertical temperature variation between the vertically spaced-apart temperature measurement devices (304), measuring a temperature within the electrostatic chuck using the two vertically spaced-apart temperature measurement devices (306), and controlling a temperature differential between the two vertically spaced-apart temperature measurement devices 238-242 below the predetermined threshold (308).

Step 302 includes providing an electrostatic chuck, such as electrostatic chuck described herein (e.g., electrostatic chuck 201). For example, the electrostatic chuck can include a ceramic body, a heating element embedded within the ceramic body, and a plurality of temperature measurement devices embedded within the ceramic body, wherein at least two of the plurality of temperature measurement devices are vertically spaced-apart temperature measurement devices.

Determining a predetermined threshold for a vertical temperature variation between the vertically spaced-apart temperature measurement devices (step 304) can suitably include selecting a predetermined threshold to mitigate thermal damage—e.g., due to varying coefficients of thermal expansion of various layers or components of the electrostatic chuck. By way of examples, the predetermined threshold can be between less than 0.1 or 0.2° C. or between about 0.4 and 0.6 or about 0.8 and 1.0° C.

Step 306 can include measuring a temperature within the electrostatic chuck using two or more vertically spaced-apart temperature measurement devices. This step can also include measuring temperatures within the electrostatic chuck at other locations. Information corresponding to the measured temperatures can be provided to a controller, such as controller 234 and/or 124.

During step 308, a controller (e.g., controller 234, 124) can provide information to a heating power source (e.g., heating power source 236) to control heating of the electrostatic chuck and/or to control a flow of cooling fluid to control cooling of the electrostatic chuck. As noted above, the heating power source can be used to provide power at a frequency between about 0.006 Hz and 1 Hz. In some cases, the power is applied to the heating element using one or more of pseudo random binary sequence (PRBS), sine sweep signal, and Schroeder phase signal.

The controller can be configured to control a temperature differential between the two vertically spaced-apart temperature measurement devices below the predetermined threshold. For example, a ramp rate of the chuck can be controlled to maintain the temperature variation (or difference) between or within the threshold. The controller can use closed-loop control. By way of example, the controller can use proportional-integral-derivative control. In some cases, the step of controlling comprises power disturbance cancellation filtering.

In accordance with yet further examples of the disclosure, the method can further include a step of generating a transfer function model to generate information used during the step of controlling. The generated information can be used to facilitate design of electrostatic chucks and/or for PID control and/or power disturbance cancellation filtering.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements (e.g., steps) described, may become apparent to those skilled in the art from the description. Such modifications and embodiments are also intended to fall within the scope of the appended claims.

What is claimed is:

1. An electrostatic chuck assembly, comprising:
an electrostatic chuck comprising:
a ceramic body having a top surface for receiving a substrate;
a heating element embedded within the ceramic body;
a first temperature measurement device embedded within the ceramic body proximate the top surface;
a second temperature measurement device embedded within the ceramic body proximate the heating element, and
a controller coupled to the first temperature measurement device and the second temperature measurement device,
wherein the first temperature measurement device and the second temperature measurement device are vertically spaced apart from each other,
wherein the controller controls a rate of a temperature change of the ceramic body based on a first temperature measurement from the first temperature measurement device and a second temperature measurement from the second temperature measurement device, and
wherein a temperature differential between the first temperature measurement device and the second temperature measurement device is maintained below a predetermined threshold.

2. The electrostatic chuck assembly of claim 1, further comprising an electrostatic electrode embedded within the ceramic body.

3. The electrostatic chuck assembly of claim 1, further comprising a plasma power electrode embedded within the ceramic body.

4. The electrostatic chuck assembly of claim 1, wherein at least one of the first temperature measurement device and the second temperature measurement device is formed within a layer comprising the heating element.

5. The electrostatic chuck assembly of claim 1, wherein the heating element comprises one or more of molybdenum, tungsten, an alloy comprising molybdenum, and an alloy comprising tungsten.

6. The electrostatic chuck assembly of claim 1, further comprising a cooling device.

7. The electrostatic chuck assembly of claim 1, further comprising a dielectric layer.

8. The electrostatic chuck assembly of claim 1, wherein one or more of the first temperature measurement device and the second temperature measurement device comprise a resistance temperature detector.

9. The electrostatic chuck assembly of claim 1, wherein the heating element comprises one or more of molybdenum, tungsten, $Mo_xW_y$, $MoSi_x$, and $WSi_x$.

10. The electrostatic chuck assembly of claim 1, wherein the ceramic body comprises an additive selected from the group consisting of one or more of $Al_2MgO_4$, $Al_2O_3$, $Y_2O_3$, MgO, $CaF_2$, and LiF.

11. The electrostatic chuck assembly of claim 1, comprising a plurality of heating zones.

12. The electrostatic chuck assembly of claim 11, comprising a temperature measurement device proximate two or more heating zones of the plurality of heating zones.

13. A method of controlling a temperature of an electrostatic chuck, the method comprising the steps of:
providing an electrostatic chuck comprising a ceramic body, a heating element embedded within the ceramic body, and a plurality of temperature measurement devices embedded within the ceramic body, wherein at least two of the plurality of temperature measurement devices are vertically spaced-apart temperature measurement devices;
determining a predetermined threshold for a vertical temperature variation between the vertically spaced-apart temperature measurement devices;
measuring a temperature within the electrostatic chuck using the two vertically spaced-apart temperature measurement devices; and
controlling a temperature differential between the two vertically spaced-apart temperature measurement devices below the predetermined threshold.

14. The method of claim 13, wherein the step of controlling comprises providing power to a heating element, wherein the power has a frequency between about 0.006 Hz and 1 Hz.

15. The method of claim 14, wherein the power is applied to the heating element using one or more of pseudo random binary sequence (PRBS), sine sweep signal, and Schroeder phase signal.

16. The method of claim 13, further comprising a step of generating a transfer function model to generate information used during the step of controlling.

17. The method of claim 13, wherein the step of controlling comprises proportional-integral-derivative control.

18. The method of claim 13, wherein the step of controlling comprises power disturbance cancellation filtering.

19. The method claim 13, wherein the step of controlling comprises closed-loop temperature control based on temperature information from the plurality of temperature measurement devices.

* * * * *